United States Patent
Li et al.

(10) Patent No.: US 8,155,347 B2
(45) Date of Patent: Apr. 10, 2012

(54) POP NOISE ELIMINATING CIRCUIT THAT DISABLES AN AUDIO OUTPUT DEVICE WHEN TURNING THE DEVICE ON

(75) Inventors: Chieh-Jung Li, Kaohsiung (TW); Yung-Chih Huang, Changhua County (TW)

(73) Assignees: Universal Scientific Industrial Co., Ltd., Shanghai (CN); Universal Global Scientific Industrial Co., Ltd., Tsaotuen, Nantou (TW)

( * ) Notice: Subject to any disclaimer, the term of this patent is extended or adjusted under 35 U.S.C. 154(b) by 1051 days.

(21) Appl. No.: 12/054,795

(22) Filed: Mar. 25, 2008

(65) Prior Publication Data
US 2009/0245534 A1   Oct. 1, 2009

(51) Int. Cl.
*H04B 15/00*   (2006.01)
(52) U.S. Cl. .................................... 381/94.5
(58) Field of Classification Search .............. 381/92–94, 381/94.5
See application file for complete search history.

(56) References Cited

U.S. PATENT DOCUMENTS

| | | | |
|---|---|---|---|
| 7,050,827 B2 * | 5/2006 | Lai et al. | 455/550.1 |
| 7,170,266 B1 * | 1/2007 | Seven et al. | 323/268 |
| 7,843,263 B2 * | 11/2010 | Wu et al. | 330/251 |
| 2004/0239418 A1 * | 12/2004 | Inagaki | 330/51 |
| 2008/0030267 A1 * | 2/2008 | Yang | 330/10 |
| 2008/0089533 A1 * | 4/2008 | Theus et al. | 381/94.5 |
| 2008/0232610 A1 * | 9/2008 | Kung | 381/94.1 |
| 2009/0196435 A1 * | 8/2009 | Miao | 381/94.5 |
| 2009/0210177 A1 * | 8/2009 | McCullough et al. | 702/60 |
| 2010/0141342 A1 * | 6/2010 | Pujol et al. | 330/261 |
| 2011/0060593 A1 * | 3/2011 | Hu | 704/500 |
| 2011/0065403 A1 * | 3/2011 | Muhammad et al. | 455/232.1 |

* cited by examiner

*Primary Examiner* — Nathan Ha
(74) *Attorney, Agent, or Firm* — Browdy and Neimark, PLLC

(57) ABSTRACT

An pop noise eliminating circuit includes a power source, a grounding terminal, a speaker, an audio amplifier that has two opposite ends respectively connected with the power source and the first end of the speaker, a delay unit that has one end electrically connected with the power source, a first power control switch that has a control end electrically connected with the delay unit, a first conduction end electrically connected with the other end of the speaker, and a second power control switch that has a control end electrically connected with the delay unit, a first conduction end electrically connected with the grounding terminal, and a second conduction end electrically connected with a second conduction end of the first power control switch.

6 Claims, 1 Drawing Sheet

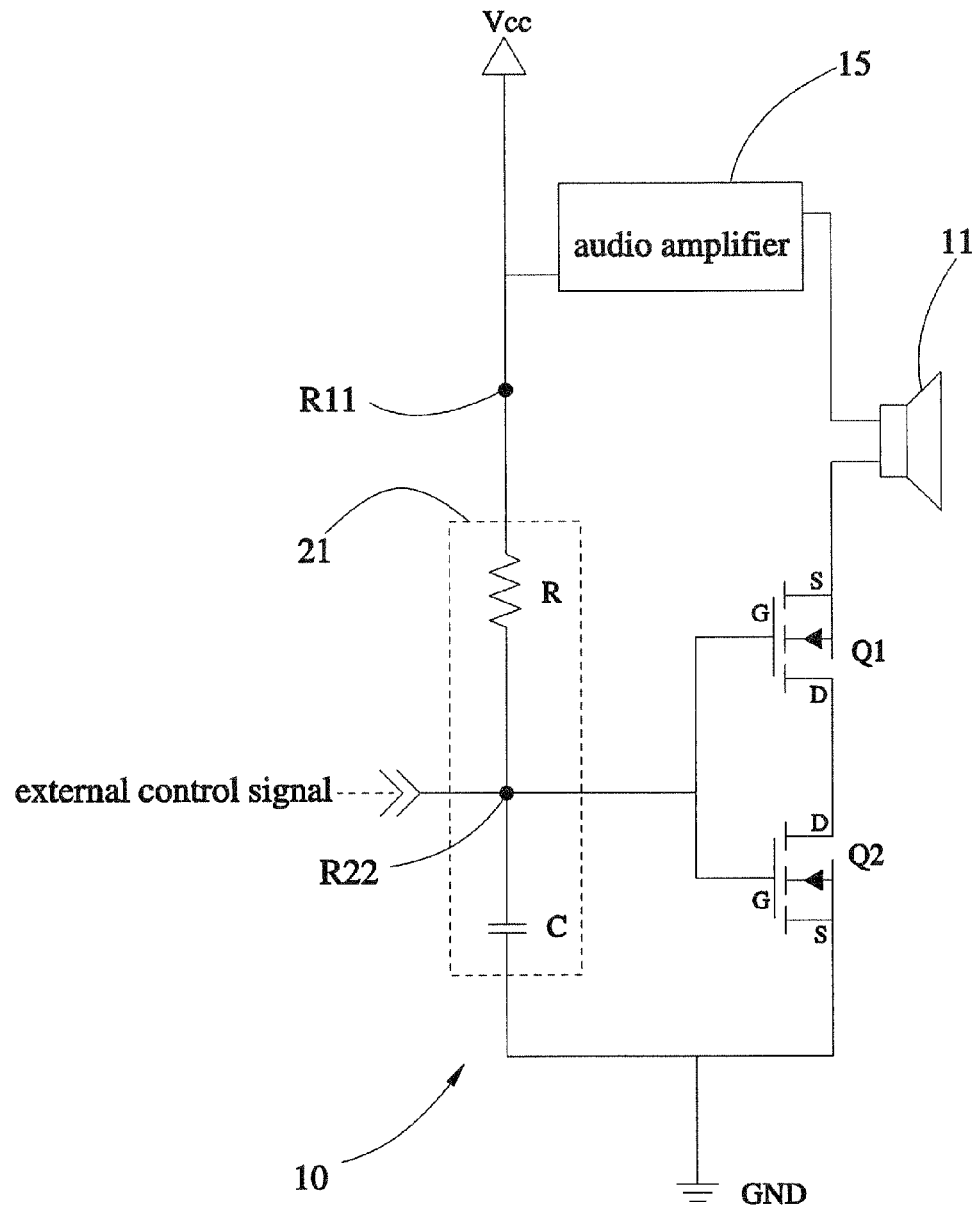

POP NOISE ELIMINATING CIRCUIT THAT DISABLES AN AUDIO OUTPUT DEVICE WHEN TURNING THE DEVICE ON

BACKGROUND OF THE INVENTION

1. Field of the Invention

The present invention relates to electronic circuits and more particularly, to an pop noise eliminating circuit that eliminates pop noises when turning on an audio output device.

2. Description of the Related Art

Pop noises may be produced when turning on an audio output device. When turning on an audio output device, the status of the power is unstable, and a pulse will occur. This pulse is misregarded as a sound signal and amplifed by an amplifying circuit, producing pop noises. This problem should be eliminated.

A conventional pop noise eliminator comprises a parallel architecture of two transistors. The pop noise eliminator attempts to eliminate pop noises by means of activating the transistors before starting up power supply.

However, the aforesaid transistor application technique can simply lower the voltage of the pulse. It cannot completely eliminate the pulse. Because the transistors still have therein a bias voltage about 0V~0.2V. Therefore, a condition of pop noise will still occur.

SUMMARY OF THE INVENTION

The present invention has been accomplished under the circumstances in view. It is the main object of the present invention to provide an pop noise eliminating circuit that eliminates pop noises when turning on an audio output device.

To achieve this and other objects of the present invention, the pop noise eliminating circuit comprises a power source, a grounding terminal, a speaker, an audio amplifier, which has two opposite ends respectively connected with the power source and the first end of the speaker, a delay unit, which has one end electrically connected with the power source, a first power control switch, which has a control end electrically connected with the delay unit, a first conduction end electrically connected with the opposite end of the speaker, and a second conduction end, and a second power control switch, which has a control end electrically connected with the delay unit, a first conduction end electrically connected with the grounding terminal, and a second conduction end electrically connected with the second conduction end of the first power control switch.

BRIEF DESCRIPTION OF THE DRAWING

FIG. 1 is a circuit diagram of an pop noise eliminating circuit according to the present invention.

DETAILED DESCRIPTION OF THE INVENTION

Referring to FIG. 1, a pop noise eliminating circuit 10 in accordance with the present invention is shown comprised of a power source Vcc, a grounding terminal GND, a speaker 11, an audio amplifier 15, a delay unit 21, a first power control switch Q1, and a second power control switch Q2.

The audio amplifier 15 has two opposite ends respectively connected to the power source Vcc and one end of the speaker 11.

The delay unit 21 is comprised of a resistor R and a capacitor C. The resistor R has a first end R11 electrically connected with the power source Vcc. The capacitor C has two opposite ends respectively connected with the grounding terminal GND and the second end R22 of the resistor R.

The first power control switch Q1 is a semiconductor switch. According to this embodiment, the first power control switch Q1 is a NMOS (N-pass metal-oxide semiconductor field-effect transistor), having a control end G and two conduction ends S and D. The control end G is the gate electrically connected with the second end R22 of the resistor R. The first conduction end S is the source. The second conduction end D is the drain. The first conduction end S is electrically connected with the other end of the speaker 11.

The second power control switch Q2 is a semiconductor switch. According to this embodiment, the second power control switch Q2 is a NMOS (N-pass metal-oxide semiconductor field-effect transistor), having a control end G and two conduction ends S and D. The control end G is the gate electrically connected with the second end R22 of the resistor R. The two conduction ends S and D are the source and the drain respectively. The source S is electrically connected with the grounding terminal GND. The drain D is electrically connected with the second conduction end (drain) D of the first power control switch Q1.

Further, the second end R22 of the resistor R is controllable by an external control signal to control the two power control transistors Q1 and Q2.

The operation of the present invention is outlined hereinafter.

When the power source Vcc starts to supply power, the audio amplifier 15 is electrically connected, and at this time audio signal is transmitted to one end of the speaker 11. Because the power is unstable at this time, the pop noise from the pulse is also transmitted to the speaker 11, however the capacitor C is not charged yet at this time. Therefore, the control ends G of the first power control switch Q1 and second power control switch Q2 are at low potential and not electrically connected. Therefore, the circuit at the other end of the speaker 11 is off, i.e., the audio output loop is in an open circuit status, and the speaker 11 has no voice output, making no pop noise.

After the power source Vcc has been supplying power for a certain period, the capacitor C is fully charged, and the control ends G of the first power control switch Q1 and second power control switch Q2 are at high potential and electrically connected, therefore the circuit at the other end of the speaker 11 is on, i.e., the audio output loop is in a close circuit status, and the speaker 11 starts to output sound. At this time, the power source Vcc is stable, no pulse will occur, and therefore the speaker 11 does not produce pop noises.

As stated above, the invention has the speaker be off during production of an pop noise, thereby eliminating output of any sound through the speaker at this time. Therefore, the invention completely eliminates the occurrence of pop noises.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A pop noise eliminating circuit comprising: a power source, a grounding terminal and a speaker; an audio amplifier, said audio amplifier having two opposite ends respectively connected with said power source and a first end of said speaker; a delay unit, said delay unit having one end electrically connected with said power source; a first power control switch, said first power control switch having a control end electrically connected with said delay unit, a first conduction end electrically connected with an opposite end of said speaker, and a second conduction end; and a second power control switch, said second power control switch having a control end electrically connected with said delay unit, a first conduction end electrically connected with said grounding terminal, and a second conduction end electrically connected with the second conduction end of said first power control switch, wherein said delay unit is comprised of a resistor and a capacitor, said resistor having a first end electrically connected with said power source and a second end electrically connected with said capacitor, said capacitor having two opposite ends respective electrically connected with the second end of said resistor and said grounding terminal, and wherein the second end of said resistor is electrically connected with the control end of said first power control switch and the control end of said second power control switch.

2. The pop noise eliminating circuit as claimed in claim 1, wherein said first power control switch and said second power control switch are semiconductor switches.

3. The pop noise eliminating circuit as claimed in claim 2, wherein said first power control switch and said second power control switch are N-pass metal-oxide semiconductor field-effect transistors.

4. The pop noise eliminating circuit as claimed in claim 3, wherein the control ends of said first power control switch and said second power control switch are the gate; the first conduction ends of said first power control switch and said second power control switch are the source; the second conduction ends of said first power control switch and said second power control switch are the drain; the drain of said first power control switch is electrically connected with the drain of said second power control switch; the source of said second power control switch is electrically connected with said grounding terminal.

5. The pop noise eliminating circuit as claimed in claim 3, wherein the second end of said resistor is further connected to receive an external control signal.

6. The pop noise eliminating circuit as claimed in claim 3, wherein the first end of said resistor is directly connected to said power source.

* * * * *